(12) United States Patent
Shang et al.

(10) Patent No.: US 11,462,149 B2
(45) Date of Patent: Oct. 4, 2022

(54) SHIFT REGISTER UNIT AND METHOD FOR DRIVING THE SAME, GATE DRIVING CIRCUIT AND DISPLAY DEVICE

(71) Applicant: BOE Technology Group Co., Ltd., Beijing (CN)

(72) Inventors: Guangliang Shang, Beijing (CN); Jiangnan Lu, Beijing (CN); Jie Zhang, Beijing (CN); Yu Feng, Beijing (CN); Libin Liu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/275,068

(22) PCT Filed: Apr. 24, 2020

(86) PCT No.: PCT/CN2020/086603
§ 371 (c)(1),
(2) Date: Mar. 10, 2021

(87) PCT Pub. No.: WO2021/212449
PCT Pub. Date: Oct. 28, 2021

(65) Prior Publication Data
US 2021/0398478 A1 Dec. 23, 2021

(51) Int. Cl.
*G11C 19/00* (2006.01)
*G09G 3/20* (2006.01)
*G11C 19/28* (2006.01)

(52) U.S. Cl.
CPC ... *G09G 3/2092* (2013.01); *G09G 2310/0286* (2013.01); *G09G 2310/08* (2013.01); *G11C 19/28* (2013.01)

(58) Field of Classification Search
None
See application file for complete search history.

(56) References Cited

U.S. PATENT DOCUMENTS

| 5,701,136 A | 12/1997 | Huq et al. |
| 7,460,634 B2 | 12/2008 | Deane |

(Continued)

FOREIGN PATENT DOCUMENTS

| CN | 1157450 A | 8/1997 |
| CN | 1993726 A | 7/2007 |

(Continued)

*Primary Examiner* — Tuan T Lam
(74) *Attorney, Agent, or Firm* — Westman, Champlin & Koehler, P.A.

(57) ABSTRACT

Embodiments of the present disclosure provide a shift register unit and a method foe driving the same, a gate driving circuit, and a display device. The shift register unit includes: a control circuit coupled to an input signal terminal, a clock signal terminal, and an output control terminal, and configured to provide an output control signal to the output control terminal based on a signal from the input signal terminal and a signal from the clock signal terminal; and an output circuit coupled to the output control terminal, an output signal terminal, and a threshold voltage control terminal, and configured to provide an output signal to the output signal terminal under control of a potential at the output control terminal, and adjust a threshold voltage of at least one of a plurality of transistors in the output circuit under control of a signal from the threshold voltage control terminal.

20 Claims, 13 Drawing Sheets

(56) References Cited

U.S. PATENT DOCUMENTS

| | | | |
|---|---|---|---|
| 10,424,266 | B2 | 9/2019 | Chang et al. |
| 10,884,556 | B2 | 1/2021 | Lee et al. |
| 2007/0248205 | A1 | 10/2007 | Deane |
| 2008/0226013 | A1 | 9/2008 | Deane |
| 2011/0134107 | A1 | 6/2011 | Lebrun et al. |
| 2013/0034199 | A1* | 2/2013 | Toyotaka ............ G09G 3/3674 377/75 |
| 2014/0023173 | A1* | 1/2014 | Miyake ............... G11C 19/188 377/54 |
| 2018/0130435 | A1* | 5/2018 | Lee ..................... G09G 3/3677 |
| 2018/0151146 | A1 | 5/2018 | Chang et al. |
| 2019/0066616 | A1* | 2/2019 | Zeng ................ G02F 1/133514 |
| 2019/0196618 | A1 | 6/2019 | Lee et al. |
| 2019/0251921 | A1* | 8/2019 | Ono ....................... G11C 19/28 |
| 2021/0020090 | A1* | 1/2021 | Shang ................... G11C 19/28 |
| 2021/0335265 | A1* | 10/2021 | Xue .................... G09G 3/3266 |

FOREIGN PATENT DOCUMENTS

| | | |
|---|---|---|
| CN | 101147202 A | 3/2008 |
| CN | 101515431 A | 8/2009 |
| CN | 108122523 A | 6/2018 |
| CN | 110010049 A | 7/2019 |

* cited by examiner

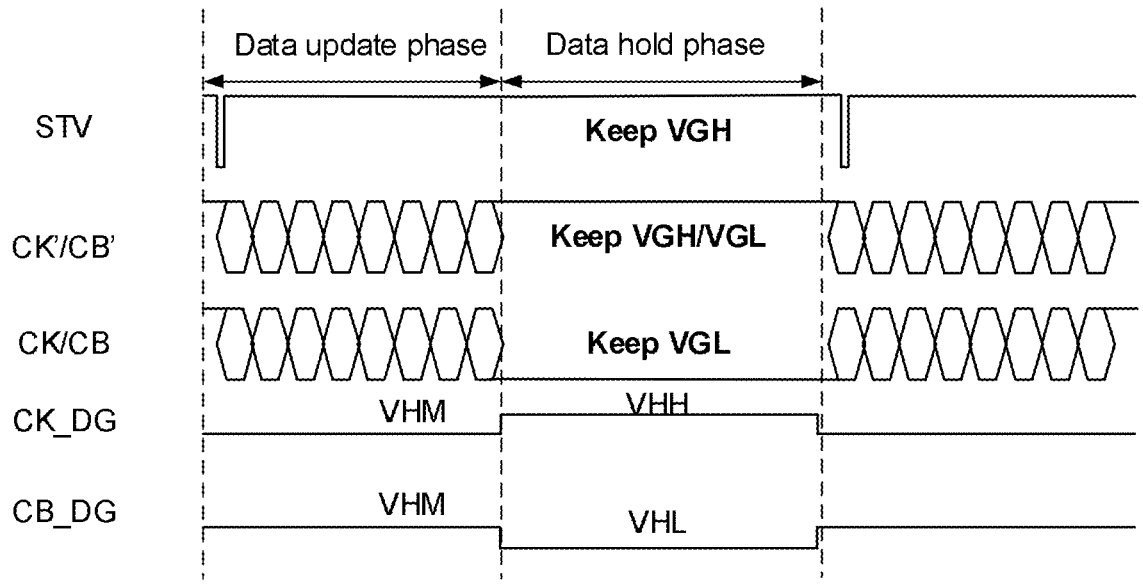

FIG. 13

| In the first period, a control circuit provides an output control signal to an output control terminal based on a signal from an input signal terminal and a signal from a clock signal terminal, and an output circuit provides an output signal to an output signal terminal under control of a potential at the output control terminal | — S101 |

| In the second period, the output circuit adjusts the threshold voltage of at least one of the plurality of transistors in the output circuit under control of a signal from the threshold voltage control terminal | — S102 |

FIG. 14

SHIFT REGISTER UNIT AND METHOD FOR DRIVING THE SAME, GATE DRIVING CIRCUIT AND DISPLAY DEVICE

CROSS-REFERENCE TO RELATED APPLICATION

This Application is a Section 371 National Stage Application of International Application No. PCT/CN2020/086603, filed Apr. 24, 2020, which has not yet published, in Chinese, the contents of which are hereby incorporated by reference in their entirety.

TECHNICAL FIELD

The present disclosure relates to the field of display, and particularly to a shift register unit and a method for driving the same, a gate driving circuit, and a display device.

BACKGROUND

In a display device, the voltage that controls the pixel brightness changes with time due to leakage. In order to keep the fluctuation of pixel brightness within a reasonable range, even for static pictures, the gate driving circuit is required to scan the pixels at a certain frequency to refresh the display data (voltage) provided to the pixels, which will lead to higher power consumption. Generally, the purpose of reducing power consumption is achieved by reducing the refresh frequency. The conventional gate driving circuit may operate normally at a normal refresh frequency (for example, above 30 Hz), but a large noise may be generated in the scan signal output at an ultra-low refresh frequency (for example, 1 Hz), which affects the pixel display.

SUMMARY

According to an aspect of the present disclosure, there is provided a shift register unit, comprising: a control circuit coupled to an input signal terminal, a clock signal terminal, and an output control terminal, and configured to provide an output control signal to the output control terminal based on a signal from the input signal terminal and a signal from the clock signal terminal; and an output circuit coupled to the output control terminal, an output signal terminal, and a threshold voltage control terminal, and configured to provide an output signal to the output signal terminal under control of a potential at the output control terminal, and adjust a threshold voltage of at least one of a plurality of transistors in the output circuit under control of a signal from the threshold voltage control terminal.

In some embodiments, the output circuit comprises: a charging sub-circuit coupled to a power signal terminal, the output control terminal, and the output signal terminal, and configured to provide a potential at the power signal terminal to the output signal terminal under control of a potential at the output control terminal; a discharging sub-circuit coupled to a discharge control node, a reference signal terminal, and the output signal terminal, and configured to provide a potential at the reference signal terminal to the output signal terminal under control of a potential at the discharge control node; and a control sub-circuit coupled to the output control terminal and the discharge control node, and configured to control the potential at the discharge control node based on the potential at the output control terminal, wherein at least one of the charging sub-circuit, the discharging sub-circuit, and the control sub-circuit is further coupled to the threshold voltage control terminal and is further configured to adjust a threshold voltage of at least one of the plurality of transistors in the at least one of the charging sub-circuit, the discharging sub-circuit, and the control sub-circuit under control of a signal from the threshold voltage control terminal.

In some embodiments, the charging sub-circuit comprises a first transistor, a gate of the first transistor is coupled to the output control terminal, a first electrode of the first transistor is coupled to the power signal terminal, and a second electrode of the first transistor is coupled to the output signal terminal.

In some embodiments, the threshold voltage control terminal comprises a first threshold voltage control terminal, and the first transistor is a dual-gate transistor having a first gate and a second gate, the first gate of the first transistor is coupled to the output control terminal, and the second gate of the first transistor is coupled to the first threshold voltage control terminal.

In some embodiments, the discharging sub-circuit comprises: a second transistor, a gate of the second transistor is coupled to the discharge control node, a first electrode of the second transistor is coupled to the reference signal terminal, and a second electrode of the second transistor is coupled to the output signal terminal; and a first capacitor, a first terminal of the first capacitor is coupled to the discharge control node, and a second terminal of the first capacitor is coupled to the output signal terminal.

In some embodiments, the threshold voltage control terminal comprises a second threshold voltage control terminal, and the second transistor is a dual-gate transistor having a first gate and a second gate, the first gate of the second transistor is coupled to the discharge control node, and the second gate of the second transistor is coupled to the second threshold voltage control terminal.

In some embodiments, the threshold voltage control terminal comprises a first threshold voltage control terminal and a second threshold voltage control terminal, and the first transistor and the second transistor are both dual-gate transistors having a first gate and a second gate, wherein the first gate of the first transistor is coupled to the output control terminal, and the second gate of the first transistor is coupled to the first threshold voltage control terminal; the first gate of the second transistor is coupled to the discharge control node, and the second gate of the second transistor is coupled to the second threshold voltage control terminal.

In some embodiments, the control sub-circuit comprises: a third transistor, a gate of the third transistor is coupled to the output control terminal, a first electrode of the third transistor is coupled to the power signal terminal, and a second electrode of the third transistor is coupled to the discharge control node; a fourth transistor, a gate of the fourth transistor is coupled to a first clock signal terminal, a first electrode of the fourth transistor is coupled to the reference signal terminal, and a second electrode of the fourth transistor is coupled to the discharge control node; and a second capacitor, a first terminal of the second capacitor is coupled to a second clock signal terminal, and a second terminal of the second capacitor is coupled to the discharge control node.

In some embodiments, the threshold voltage control terminal comprises a first threshold voltage control terminal, and the third transistor is a dual-gate transistor having a first gate and a second gate, the first gate of the third transistor is coupled to the output control terminal, and the second gate of the third transistor is coupled to the first threshold voltage control terminal.

In some embodiments, the threshold voltage control terminal comprises a second threshold voltage control terminal, and the fourth transistor is a dual-gate transistor having a first gate and a second gate, the first gate of the fourth transistor is coupled to the first clock signal terminal, and the second gate of the fourth transistor is coupled to the second threshold voltage control terminal.

In some embodiments, the threshold voltage control terminal comprises a first threshold voltage control terminal and a second threshold voltage control terminal, and the third transistor and the fourth transistor are both dual-gate transistors having a first gate and a second gate, wherein the first gate of the third transistor is coupled to the output control terminal, and the second gate of the third transistor is coupled to the first threshold voltage control terminal; the first gate of the fourth transistor is coupled to the first clock signal terminal, and the second gate of the fourth transistor is coupled to the second threshold voltage control terminal.

In some embodiments, the control circuit comprises: an input sub-circuit coupled to an input signal terminal, a reference signal terminal, a third clock signal terminal, a first control node, and a second control node, and configured to provide a potential at the input signal terminal to the first control node, and a potential at the reference signal terminal to the second control node under control of a signal from the third clock signal terminal; an output sub-circuit coupled to the first control node, the second control node, the output control terminal, a fourth clock signal terminal, and the power signal terminal, and configured to provide a potential at the fourth clock signal terminal to the output control terminal under control of a potential at the first control node, and provide a potential at the power signal terminal to the output control terminal under control of the second control node; and an adjustment sub-circuit coupled to the third clock signal terminal, the fourth clock signal terminal, the power signal terminal, the first control node, and the second control node, and configured to provide a potential at the third clock signal terminal to the second control node under control of the potential at the first control node, and provide the potential at the power signal terminal to the first control node under control of the potential at the fourth clock signal terminal and a potential at the second control node.

In some embodiments, the input sub-circuit comprises: a fifth transistor, a gate of the fifth transistor is coupled to the third clock signal terminal, a first electrode of the fifth transistor is coupled to the input signal terminal, and a second electrode of the fifth transistor is coupled to the first control node; and a sixth transistor, a gate of the sixth transistor is coupled to the third clock signal terminal, a first electrode of the sixth transistor is coupled to the reference signal terminal, and a second electrode of the sixth transistor is coupled to the second control node.

In some embodiments, the output sub-circuit comprises: a seventh transistor, a gate of the seventh transistor is coupled to the reference signal terminal, and a first electrode of the seventh transistor is coupled to the first control node; an eighth transistor, a gate of the eighth transistor is coupled to the second electrode of the seventh transistor, a first electrode of the eighth transistor is coupled to the fourth clock signal terminal, and a second electrode of the eighth transistor is coupled to the output control terminal; a ninth transistor, a gate of the ninth transistor is coupled to the second control node, a first electrode of the ninth transistor is coupled to the power signal terminal, and a second electrode of the ninth transistor is coupled to the output control terminal; a third capacitor, a first terminal of the third capacitor is coupled to the gate of the eighth transistor, and a second terminal of the third capacitor is coupled to the second electrode of the eighth transistor; and a fourth capacitor, a first terminal of the fourth capacitor is coupled to the gate of the ninth transistor, and a second terminal of the fourth capacitor is coupled to the first electrode of the ninth transistor.

In some embodiments, the adjustment sub-circuit comprises: a tenth transistor, a gate of the tenth transistor is coupled to the first control node, a first electrode of the tenth transistor is coupled to the third clock signal terminal, and a second electrode of the tenth transistor is coupled to the second control node; an eleventh transistor, a gate of the eleventh transistor is coupled to the second control node, and a first electrode of the eleventh transistor is coupled to the power signal terminal; and a twelfth transistor, a gate of the twelfth transistor is coupled to the fourth clock signal terminal, a first electrode of the twelfth transistor is coupled to the second electrode of the eleventh transistor, and a second electrode of the twelve transistor is coupled to the first control node.

According to another aspect of the present disclosure, there is provided a gate driving circuit comprising a plurality of stages of cascaded shift register units described above, wherein threshold voltage control terminals of the plurality of stages of cascaded shift register units are coupled to receive a threshold voltage control signal.

According to another aspect of the present disclosure, there is provided a display device comprising the gate driving circuit described above.

According to another aspect of the present disclosure, there is provided a method for driving a shift register unit described above, comprising: in first period, providing, by a control circuit, an output control signal to an output control terminal based on a signal from an input signal terminal and a signal from a clock signal terminal, and providing, by an output circuit, an output signal to an output signal terminal under control of a potential at the output control terminal; and in second period, providing, by the control circuit, the output control signal to the output control terminal based on the signal from the input signal terminal and the signal from the clock signal terminal, and keeping, by the output circuit, a level of the output signal from the output signal terminal under control of the potential at the output control terminal, and adjusting a threshold voltage of at least one of a plurality of transistors in the output circuit under control of a signal from a threshold voltage control terminal.

In some embodiments, the output circuit comprises a first transistor, a second transistor, a third transistor, and a fourth transistor, the threshold voltage control terminal comprises a first threshold voltage control terminal, and at least one of the first transistor and the third transistor is a dual-gate transistor having a first gate and a second gate coupled to the first threshold voltage control terminal, and adjusting a threshold voltage of at least one of a plurality of transistors in the output circuit under control of a signal from a threshold voltage control terminal comprising: applying a threshold voltage control signal being at a first level to the first threshold voltage control terminal, to change the threshold voltage of the at least one of the first transistor and the third transistor, such that the at least one of the first transistor and the third transistor becomes an enhancement type transistor.

In some embodiments, the first level is higher than a level of a power signal from a power signal terminal coupled to the first transistor and the third transistor.

In some embodiments, the output circuit comprises a first transistor, a second transistor, a third transistor, and a fourth transistor, and the threshold voltage control terminal comprises a second threshold voltage control terminal, and at least one of the second transistor and the fourth transistor is a dual-gate transistor having a first gate and a second gate coupled to the second threshold voltage control terminal, and adjusting a threshold voltage of at least one of a plurality of transistors in the output circuit under control of a signal from a threshold voltage control terminal comprising: applying a threshold voltage control signal being at a second level to the second threshold voltage control terminal, to change the threshold voltage of the at least one of the second transistor and the fourth transistor, such that the at least one of the second transistor and the fourth transistor becomes a depletion type transistor.

In some embodiments, the second level is lower than a level of a reference signal from a reference signal terminal coupled to the second transistor and the fourth transistor.

BRIEF DESCRIPTION OF THE DRAWINGS

FIG. 13 shows an operation timing diagram of the shift register unit in the data update phase and the data hold phase according to an embodiment of the present disclosure.

FIG. 14 shows a flowchart of a driving method of a shift register unit according to an embodiment of the present disclosure.

DETAILED DESCRIPTION OF EMBODIMENTS

In order to make the objectives, technical solutions, and advantages of the embodiments of the present disclosure clearer, the technical solutions in the embodiments of the present disclosure will be described clearly and completely in conjunction with the accompanying drawings in the embodiments of the present disclosure. Obviously, the described embodiments are part of the embodiments of the present disclosure, but not all of them. Based on the described embodiments of the present disclosure, all other embodiments obtained by those of ordinary skill in the art without creative labor are within the protection scope of the present disclosure. It should be noted that throughout the drawings, the same elements are represented by the same or similar reference signs. In the following description, some specific embodiments are only used for descriptive purposes, and should not be construed as limiting the present disclosure, but are merely examples of the embodiments of the present disclosure. When it may cause confusion in the understanding of the present disclosure, the conventional structure or configuration will be omitted. It should be noted that the shape and size of each component in the figure do not reflect the actual size and ratio, but merely illustrate the content of the embodiment of the present disclosure.

Unless otherwise defined, the technical terms or scientific terms used in the embodiments of the present disclosure should have the usual meanings understood by those skilled in the art. The "first", "second" and similar words used in the embodiments of the present disclosure do not denote any order, quantity or importance, but are only used to distinguish different components.

In addition, in the description of the embodiments of the present disclosure, the term "coupled" or "coupled to" may mean that two components are directly coupled, or that two components are coupled via one or more other components. In addition, these two components may be coupled or coupled by wired or wireless means.

The transistors used in the embodiments of the present disclosure may all be thin film transistors or field effect transistors or other devices with the same characteristics. In some embodiments, the thin film transistor used in the embodiment of the present disclosure may be an oxide semiconductor transistor. Since the source and drain of the thin film transistor used here are symmetrical, the source and drain may be interchanged. In the embodiments of the present disclosure, one of the source and the drain is referred to the first electrode, and the other of the source and the drain is referred to the second electrode. In the following examples, a P-type thin film transistor is taken as an example for description. Those skilled in the art may understand that the embodiments of the present disclosure may obviously be applied to the case of N-type thin film transistors.

Figure 1:
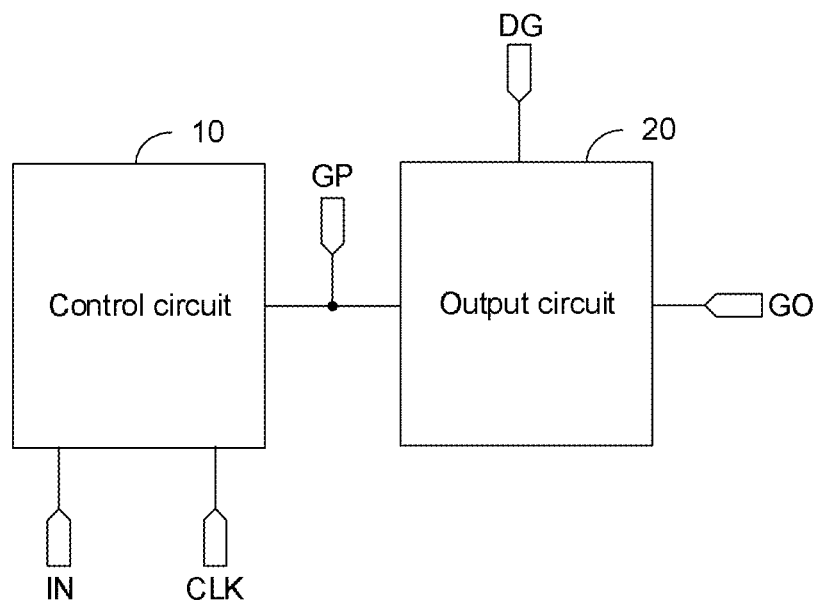
FIG. 1 shows a schematic block diagram of a shift register unit according to an embodiment of the present disclosure.

FIG. 1 shows a schematic block diagram of a shift register unit according to an embodiment of the present disclosure.

As shown in FIG. 1, the shift register unit includes a control circuit 10 and an output circuit 20.

The control circuit 10 is coupled to the input signal terminal IN, the clock signal terminal CLK, and the output control terminal GP. The control circuit 10 may provide an output control signal to the output control terminal GP based on a signal from the input signal terminal IN and a signal from the clock signal terminal CLK.

The output circuit 20 is coupled to the output control terminal GP, the output signal terminal GO, and the threshold voltage control terminal DG. The output circuit 20 may provide an output signal to the output signal terminal GO under control of a potential at the output control terminal GP, and adjust a threshold voltage of at least one of a plurality of transistors in the output circuit 20 under control of a signal from the threshold voltage control terminal DG.

The output circuit of the shift register unit usually includes a plurality of transistors. During the operation of the shift register unit, one or some of these transistors are in an on state, and the other or some are in an off state. Transistors in the off state may generate a certain amount of leakage current due to a certain voltage difference between the source and drain, resulting in leakage; the transistors in the on state may have insufficient conduction due to unstable gate voltage, all of these may cause noise in the output signal from the output signal terminal. The embodiment of the present disclosure allows the output circuit to adjust the threshold voltage of at least one of the plurality of transistors in the output circuit under the control of the signal from the threshold voltage control terminal, so that the current of the transistor in the off state is reduced and the current of the transistor that needs to be in the on state is increased without changing the gate voltage of the transistor, thereby reducing the noise generated in the output signal due to the leakage or insufficient conduction of the transistors.

Hereinafter, some examples of the output circuit of the embodiment of the present disclosure will be illustrated with reference to FIGS. 2 to 7.

Figure 2:
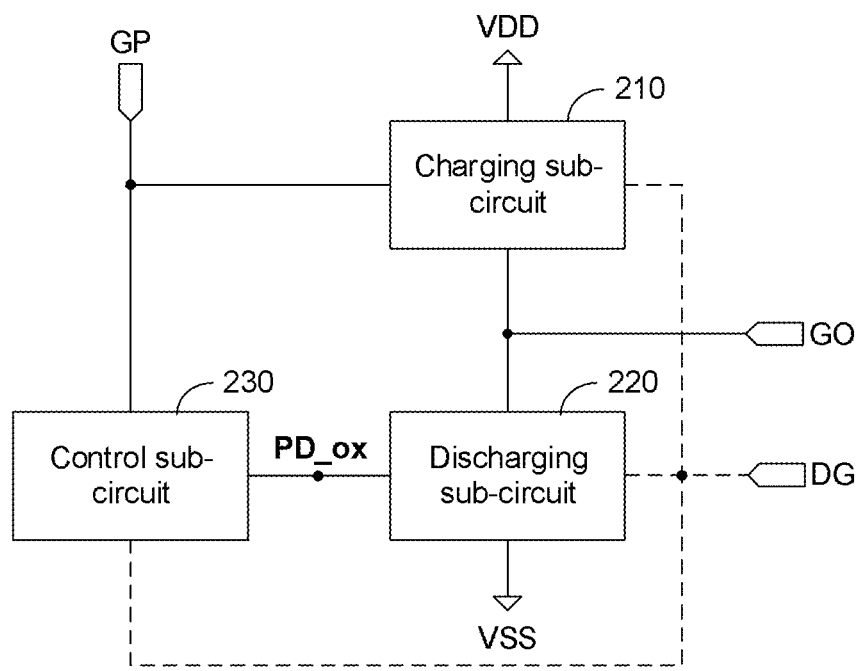
FIG. 2 shows a schematic block diagram of an output circuit in a shift register unit according to an embodiment of the present disclosure.

FIG. 2 shows a schematic block diagram of an output circuit in a shift register unit according to an embodiment of the present disclosure.

The output circuit 200 includes a charging sub-circuit 210, a discharging sub-circuit 220, and a control sub-circuit 230.

The charging sub-circuit 210 is coupled to a power signal terminal VDD, an output control terminal GP, and an output signal terminal GO. The charging sub-circuit 210 may provide a potential at the power signal terminal VDD to the output signal terminal GO under control of a potential at the output control terminal GP.

The discharging sub-circuit 220 is coupled to a discharge control node PD_ox, a reference signal terminal VSS, and the output signal terminal GO. The discharging sub-circuit 220 may provide a potential at the reference signal terminal VSS to the output signal terminal GO under control of a potential at the discharge control node PD_ox.

The control sub-circuit 230 is coupled to the output control terminal GP and the discharge control node PD_ox. The control sub-circuit 230 may control the potential at the discharge control node PD_ox based on the potential at the output control terminal GP.

At least one of the charging sub-circuit 210, the discharging sub-circuit 220, and the control sub-circuit 230 is also coupled to a threshold voltage control terminal DG, and the possible connection to the threshold voltage control terminal DG is shown by a dotted line in FIG. 2. One or more of the charging sub-circuit 210, the discharging sub-circuit 220, and the control sub-circuit 230, which coupled to the threshold voltage control terminal DG, may adjust a threshold voltage of at least one transistor included in the one or more of the charging sub-circuit 210, the discharging sub-circuit 220, and the control sub-circuit 230 under control of a signal from the threshold voltage control terminal DG.

Figure 3:
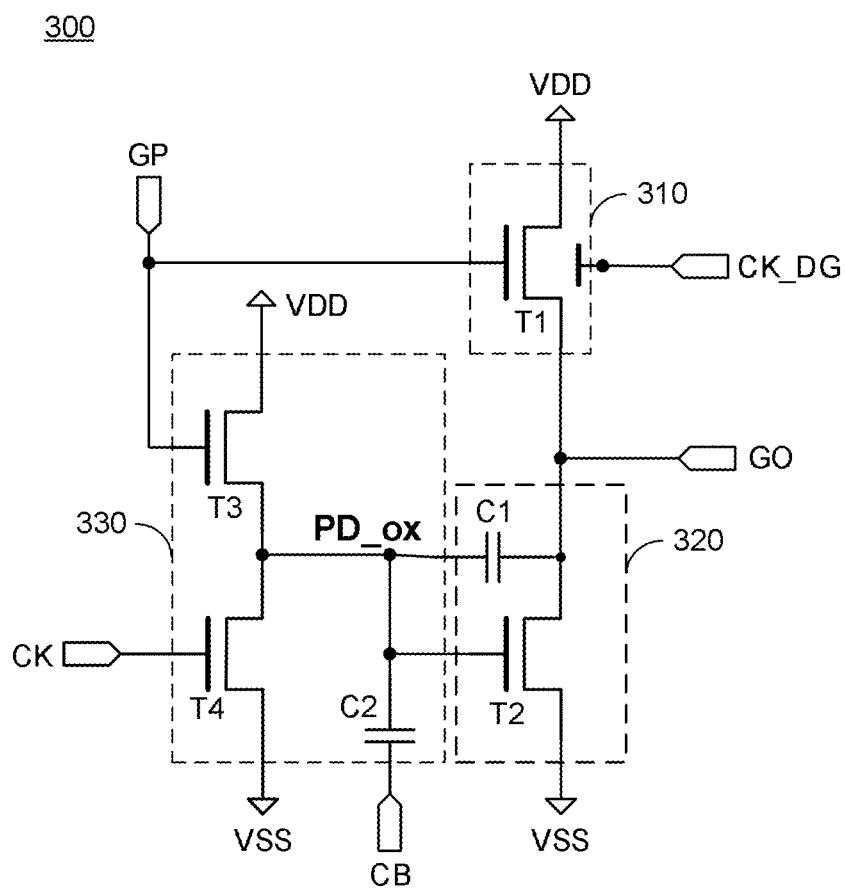
FIG. 3 shows a circuit diagram of an output circuit according to an embodiment of the present disclosure.

FIG. 3 shows a circuit diagram of an output circuit according to an embodiment of the present disclosure.

As shown in FIG. 3, the output circuit 300 includes a charging sub-circuit 310, a discharging sub-circuit 320, and a control sub-circuit 330. The above description of the charging sub-circuit 210, the discharging sub-circuit 220, and the control sub-circuit 230 is also applicable to the charging sub-circuit 310, the discharging sub-circuit 320, and the control sub-circuit 330, and will not be repeated here.

The charging sub-circuit 310 includes a first transistor T1, the discharging circuit 320 includes a second transistor T2 and a first capacitor C1, and the control sub-circuit 330 includes a third transistor T3, a fourth transistor T4, and a second capacitor C2.

In this embodiment, the first transistor T1 is a dual-gate transistor having a first gate and a second gate. The first gate of the first transistor T1 is coupled to an output control terminal GP, the second gate of the first transistor T1 is coupled to a first threshold voltage control terminal CK_DG, and a first electrode of the first transistor T1 is coupled to a power signal terminal VDD, a second electrode of the first transistor T1 is coupled to an output signal terminal GO.

A gate of the second transistor T2 is coupled to the discharge control node PD_ox, a first electrode of the second transistor T2 is coupled to a reference signal terminal VSS, and a second electrode of the second transistor T2 is coupled to the output signal terminal GO.

A first terminal of the first capacitor C1 is coupled to the discharge control node PD_ox, and a second terminal of the first capacitor C1 is coupled to the output signal terminal GO.

A gate of the third transistor T3 is coupled to the output control terminal GP, a first electrode of the third transistor T3 is coupled to the power signal terminal VDD, and a second electrode of the third transistor T3 is coupled to the discharge control node PD_ox.

A gate of the fourth transistor T4 is coupled to a first clock signal terminal CK, a first electrode of the fourth transistor T4 is coupled to the reference signal terminal VSS, and a second electrode of the fourth transistor T4 is coupled to the discharge control node PD_ox.

A first terminal of the second capacitor C2 is coupled to a second clock signal terminal CB, and a second terminal of the second capacitor C2 is coupled to the discharge control node PD_ox.

Figure 4:
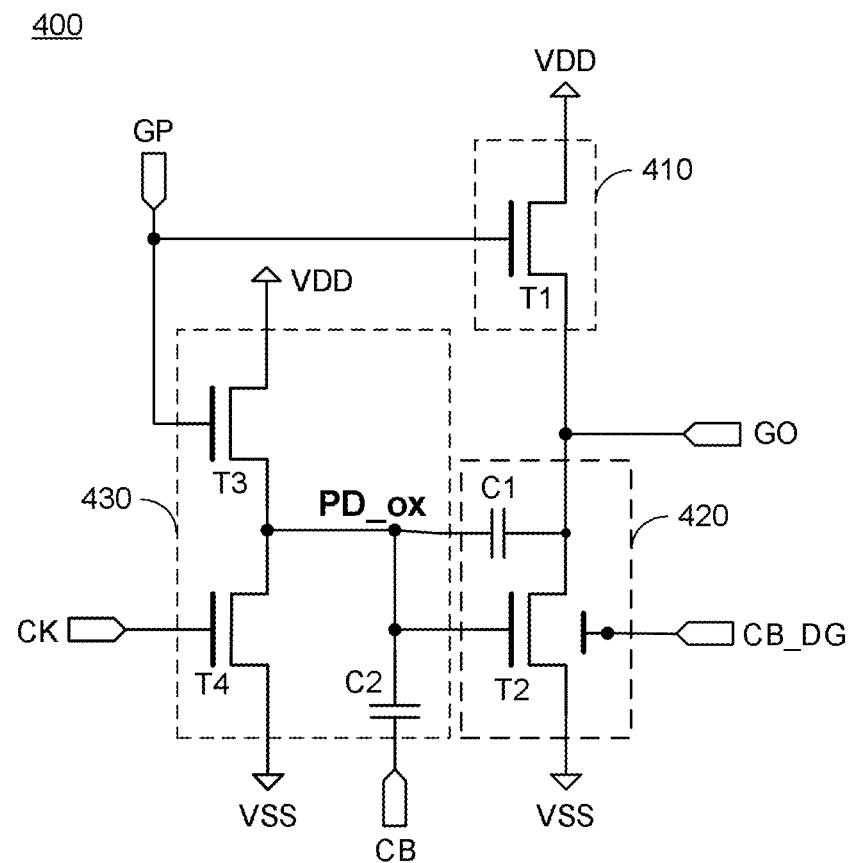
FIG. 4 shows a circuit diagram of an output circuit according to another embodiment of the present disclosure.

FIG. 4 shows a circuit diagram of an output circuit according to another embodiment of the present disclosure. The output circuit of FIG. 4 is similar to the output circuit of FIG. 3, and the difference is at least that the second transistor T2 in FIG. 4 is a dual-gate transistor. For the sake of brevity, the following will mainly describe the differences in detail.

As shown in FIG. 4, the output circuit 400 includes a charging sub-circuit 410, a discharging sub-circuit 420, and a control sub-circuit 430. The control sub-circuit 430 may be implemented in the same manner as the control sub-circuit 330 in FIG. 3, and the above description of the control sub-circuit 330 is also applicable to the control sub-circuit 430.

The charging sub-circuit 410 includes a first transistor T1, a gate of the first transistor T1 is coupled to an output control terminal GP, a first electrode of the first transistor T1 is coupled to a power signal terminal VDD, and a second electrode of the first transistor T1 is coupled to an output signal terminal GO.

The discharging sub-circuit includes a second transistor T2 and a first capacitor C1.

In this embodiment, the second transistor T2 is a dual-gate transistor having a first gate and a second gate. The first gate of the second transistor T2 is coupled to the discharge control node PD_ox, the second gate of the second transistor T2 is coupled to a second threshold voltage control terminal CB_DG, and a first electrode of the second transistor T2 is coupled to a reference signal terminal VSS, a second electrode of the second transistor T2 is coupled to the output signal terminal GO. Similar to FIG. 3, a first terminal of the first capacitor C1 in FIG. 4 is coupled to the discharge control node PD_ox, and a second terminal of the first capacitor C1 is coupled to the output signal terminal GO.

Figure 5:
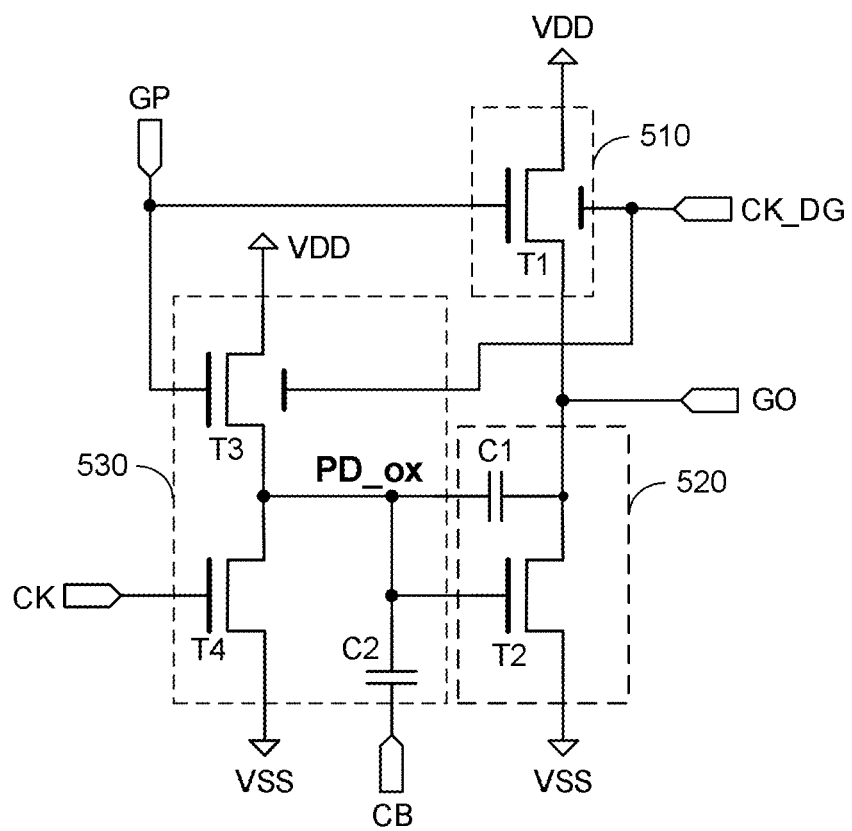
FIG. 5 shows a circuit diagram of an output circuit according to another embodiment of the present disclosure.

FIG. 5 shows a circuit diagram of an output circuit according to another embodiment of the present disclosure. The output circuit of FIG. 5 is similar to the output circuit of FIG. 3, and the difference is at least that the first transistor T1 and the third transistor T3 in FIG. 5 are both dual-gate transistors. For the sake of brevity, the following will mainly describe the differences in detail.

As shown in FIG. 5, the output circuit 500 includes a charging sub-circuit 510, a discharging sub-circuit 520, and a control sub-circuit 530. The charging sub-circuit 510 and the discharging sub-circuit 520 may be implemented in the same manner as the charging sub-circuit 310 and the discharging sub-circuit 320 in FIG. 3, respectively. The description of the charging sub-circuit 310 and the discharging sub-circuit 320 is also applicable to the charging sub-circuit. 510 and the discharging sub-circuit 520.

The control sub-circuit 530 includes a third transistor T3 and a fourth transistor T4. In this embodiment, in addition to the first transistor T1, the third transistor T3 is also a dual-gate transistor having a first gate and a second gate. The second gate of the first transistor T1 and the second gate of the third transistor T3 are both coupled to a first threshold voltage control terminal CK_DG. The first gate of the third transistor T3 is coupled to an output control terminal GP, a first electrode of the third transistor T3 is coupled to a power signal terminal VDD, and a second electrode of the third transistor T3 is coupled to a discharge control node PD_ox. Similar to that of FIG. 3, a gate of the fourth transistor T4 in FIG. 5 is coupled to a first clock signal terminal CK, a first electrode of the fourth transistor T4 is coupled to a reference signal terminal VSS, and a second electrode of the fourth transistor T4 is coupled to a discharge control node PD_ox.

Figure 6:
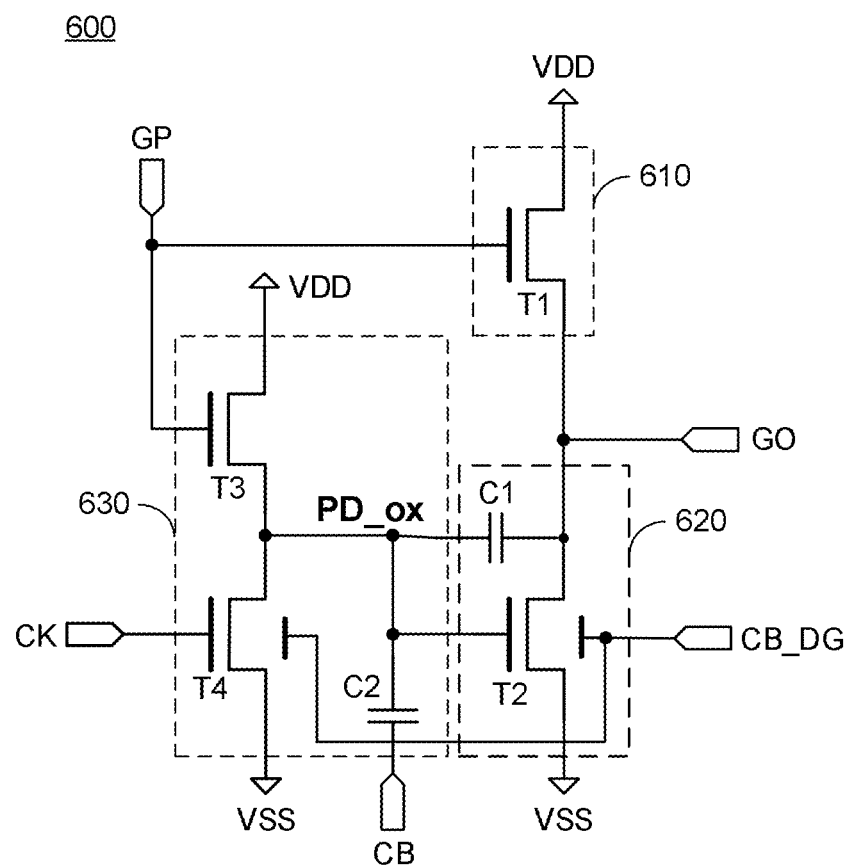
FIG. 6 shows a circuit diagram of an output circuit according to another embodiment of the present disclosure.

FIG. 6 shows a circuit diagram of an output circuit according to another embodiment of the present disclosure. The output circuit of FIG. 6 is similar to the output circuit of FIG. 3, and the difference is at least that the second transistor T2 and the fourth transistor T4 in FIG. 6 are both dual-gate transistors. For the sake of brevity, the following will mainly describe the differences in detail.

As shown in FIG. 6, the output circuit 600 includes a charging sub-circuit 610, a discharging sub-circuit 620 and a control sub-circuit 630. The charging sub-circuit 610 may be implemented in the same manner as the charging sub-circuit 310 in FIG. 3, and the above description of the charging sub-circuit 310 is also applicable to the charging sub-circuit 610.

The discharging sub-circuit 620 includes the second transistor T2 and a first capacitor C1, and the control sub-circuit 630 includes a third transistor T3 and the fourth transistor T4. In this embodiment, the second transistor T2 and the fourth transistor T4 are both dual-gate transistors with a first gate and a second gate, and the second gate of the second transistor T2 and the second gate of the fourth transistor are both coupled to a second threshold voltage control terminal CB_DG.

The first gate of the second transistor T2 is coupled to a discharge control node PD_ox, a first electrode of the second transistor T2 is coupled to a reference signal terminal VSS, and a second electrode of the second transistor T2 is coupled to an output signal terminal GO. The first gate of the fourth transistor T4 is coupled to a first clock signal terminal CK, a first electrode of the fourth transistor T4 is coupled to the reference signal terminal VSS, and a second electrode of the fourth transistor T4 is coupled to the discharge control node PD_ox. Similar to FIG. 3, a first terminal of the first capacitor C1 in FIG. 6 is coupled to the discharge control node PD_ox, and a second terminal of the first capacitor C1 is coupled to the output signal terminal GO; a gate of the third transistor T3 is coupled to an output control terminal GP, a first electrode of the third transistor T3 is coupled to a power signal terminal VDD, and a second electrode of the third transistor T3 is coupled to the discharge control node PD_ox.

Figure 7:
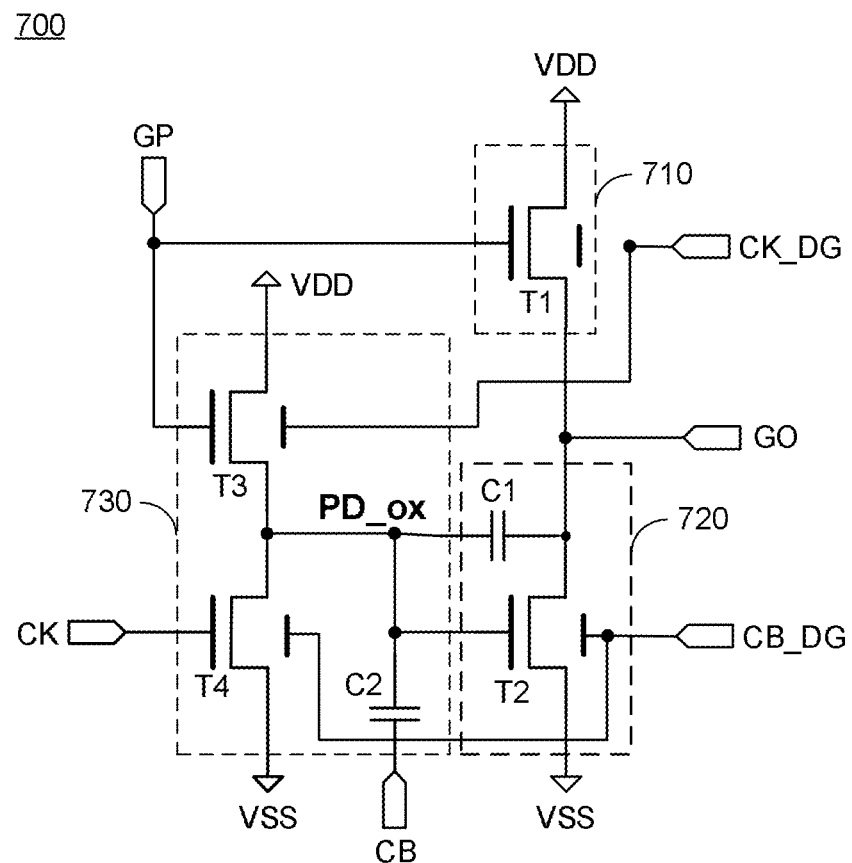
FIG. 7 shows a circuit diagram of an output circuit according to another embodiment of the present disclosure.

FIG. 7 shows a circuit diagram of an output circuit according to another embodiment of the present disclosure. The output circuit of FIG. 7 is similar to the output circuit of FIG. 5, and the difference is at least that the first transistor T1, the second transistor T2, the third transistor T3, and the fourth transistor T4 in FIG. 7 are all dual-gate transistors. For the sake of brevity, the following will mainly describe the differences in detail.

As shown in FIG. 7, the output circuit 700 includes a charging sub-circuit 710, a discharging sub-circuit 720, and a control sub-circuit 730. The charging sub-circuit 710 and the discharging sub-circuit 720 may be implemented in the same manner as the charging sub-circuit 510 and the discharging sub-circuit 520 in FIG. 5, the above description of the charging sub-circuit 510 and the discharging sub-circuit 520 is also applicable to the charging sub-circuit 710 and the discharging sub-circuit 720.

The control sub-circuit 730 includes the third transistor T3, the fourth transistor T4, and a second capacitor C2. In this embodiment, the third transistor T3 and the fourth transistor T4 are both dual-gate transistors with a first gate and a second gate. The second gate of the third transistor T3 and the second gate of the first transistor T1 are both coupled to a first threshold voltage control terminal CK_DG, and the second gate of the fourth transistor T4 and the second gate of the second transistor T2 are both coupled to a second threshold voltage control terminal CB_DG.

The first gate of the third transistor T3 is coupled to an output control terminal GP, a first electrode of the third transistor T3 is coupled to a power signal terminal VDD, and a second electrode of the third transistor T3 is coupled to a discharge control node PD_ox. The first gate of the fourth transistor T4 is coupled to a first clock signal terminal CK, a first electrode of the fourth transistor T4 is coupled to a reference signal terminal VSS, and a second electrode of the fourth transistor T4 is coupled to the discharge control node PD_ox. Similar to FIG. 5, a first terminal of the second capacitor C2 in FIG. 7 is coupled to a second clock signal terminal CB, and a second terminal of the second capacitor C2 is coupled to the discharge control node PD_ox.

In the above described embodiments of the present disclosure, at least one of the plurality of transistors (such as T1 to T4) in the output circuit is implemented as a dual-gate transistor, the first gate of the dual-gate transistor is normally coupled in the output circuit, and the second gate of the dual-gate transistor is controlled by the voltage at the corresponding threshold voltage control terminal. In this way, the threshold voltage of the transistor in the output circuit may be adjusted so that the adjusted transistor may be fully turned on or off, thereby reducing noise in the output signal. The structure and electrical characteristics of the dual-gate transistor used in the embodiment of the present disclosure will be described below with reference to FIGS. 8A, 8B, and 9.

Figure 8A:
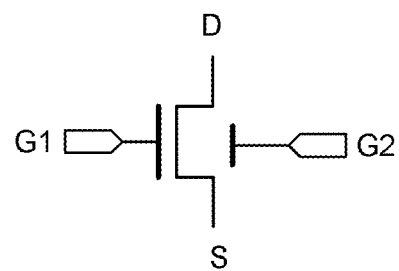
FIG. 8A shows an equivalent circuit diagram of a dual-gate transistor used in an output circuit according to an embodiment of the present disclosure.
Figure 8B:
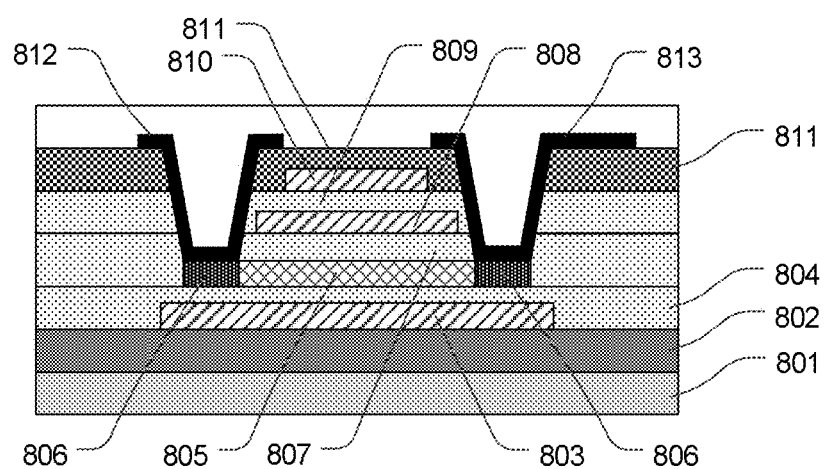
FIG. 8B shows a cross-sectional view of the dual-gate transistor of FIG. 8A.

FIG. 8A shows an equivalent circuit diagram of a dual-gate transistor used in an output circuit according to an embodiment of the present disclosure. FIG. 8B shows a cross-sectional view of the dual-gate transistor of FIG. 8A. As shown in FIG. 8A, the dual-gate transistor has a first gate G1, a second gate G2, a first electrode (for example, a source D), and a second electrode (for example, a drain S). The dual-gate transistor may transmit a signal from the first electrode to the second electrode under control of a signal at the first gate G1. The dual-gate transistor may also adjust its own threshold voltage under control of a signal at the second gate G2, which will be described in detail below with reference to FIG. 9.

As shown in FIG. 8B, the dual-gate transistor includes a second gate 803 (bottom gate) formed on a substrate 801. Optionally, a barrier layer 802 may be provided between the substrate 801 and the second gate 803. The second gate 803 is covered with a first insulating layer 804. An active layer is formed on the first insulating layer 804. The active layer includes a channel 805 and doped regions 806 on both sides of the channel 805. A second insulating layer 807 is formed on the active layer, and a first gate 808 (top gate) is formed on the second insulating layer 807. The first gate 808 (top gate) is covered with an interlayer dielectric layer 811. Optionally, an additional gate 810 may be formed between the first gate 808 and the interlayer dielectric layer 811, and an additional insulating layer 809 is provided between the additional gate 810 and the first gate 808. A via hole may be formed above the doped region 806, the via hole passing through the second insulating layer 807, the additional insulating layer 809 (if any), and the interlayer dielectric layer 811. A first electrode 812 and a second electrode 813 are formed in via holes. The first electrode 812 and the second electrode 813 are electrically coupled to the doped regions 806 on both sides of the channel 805, respectively. The substrate 801 may be a glass substrate. The first gate 808, the second gate 803, and the additional gate 810 may be made of molybdenum (Mo), and the first insulating layer 804, the second insulating layer 807, and the additional insulating layer 809 may be made of silicon oxide (SiOx).

When the dual-gate transistor is turned on, a current is generated in the channel 805 in FIG. 8B. When a same voltage is applied to the first gate, the magnitude of the current may be changed by applying different voltages to the second gate. This will be described in detail below with reference to FIG. 9.

Figure 9:
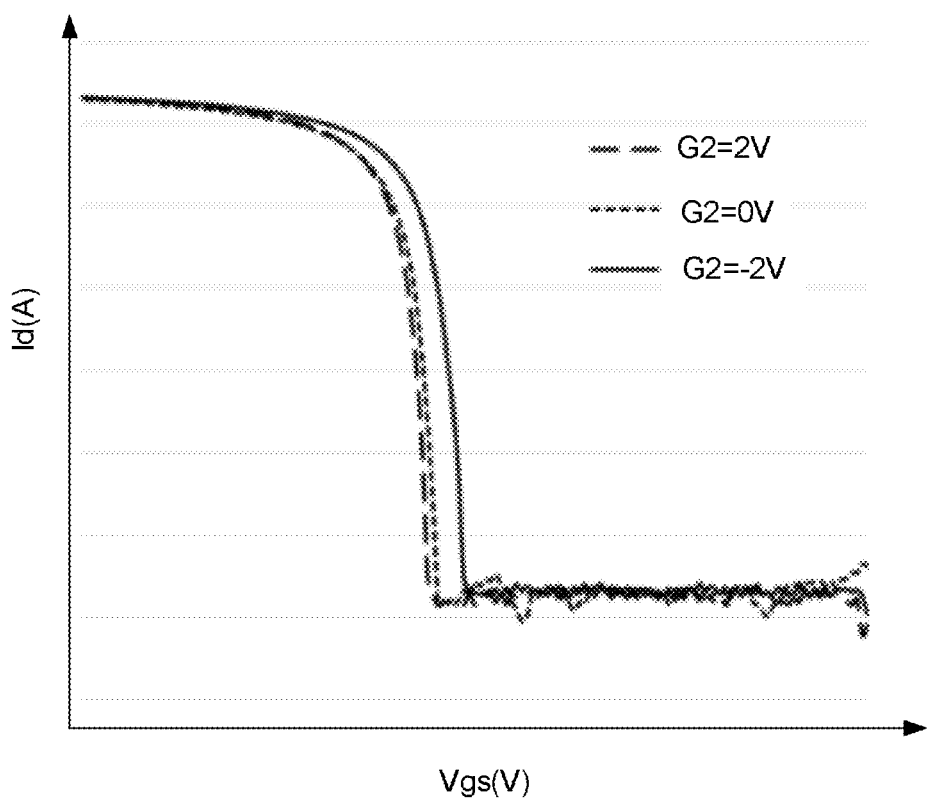
FIG. 9 shows a transmission curve diagram of a dual-gate transistor used in an output circuit according to an embodiment of the present disclosure.

FIG. 9 shows a transmission curve diagram of a dual-gate transistor used in an output circuit according to an embodiment of the present disclosure, where the abscissa represents the gate-source voltage Vgs of the dual-gate transistor, that is, the voltage between the first gate and the source, and the ordinate represents the current Id flowing through the dual-gate transistor. FIG. 9 shows the transmission curves of the dual-gate transistor when different voltages are applied to the second electrode G2 of the dual-gate transistor. As shown in FIG. 9, compared to the case that a voltage of the second gate G2 of the dual-gate transistor is equal to 0V, when a voltage of the second gate G2 is less than 0V (for example, −2V), the transmission curve of the dual-gate transistor shifts to the right, that is, for the same gate-source voltage Vgs, the threshold voltage increases, and the current Id increases (also referred to the threshold voltage shift to the right); when a voltage of the second gate G2 is greater than 0V (for example, 2V), the transmission curve of the dual-gate transistor shifts to the left, that is, for the same gate-source voltage Vgs, the threshold voltage decreases, and the current Id decreases (also referred to the threshold voltage shift to the left). For P-type transistors, a larger threshold voltage means an increase in current, so that the transistor may become a depletion type; a smaller threshold voltage means a decrease in current, so that the transistor may become an enhancement type. For N-type transistors, a larger threshold voltage means an increase in current, so that the transistor may become an enhancement type; a smaller threshold voltage means a decrease in current, so that the transistor may become a depletion type.

Figure 10:
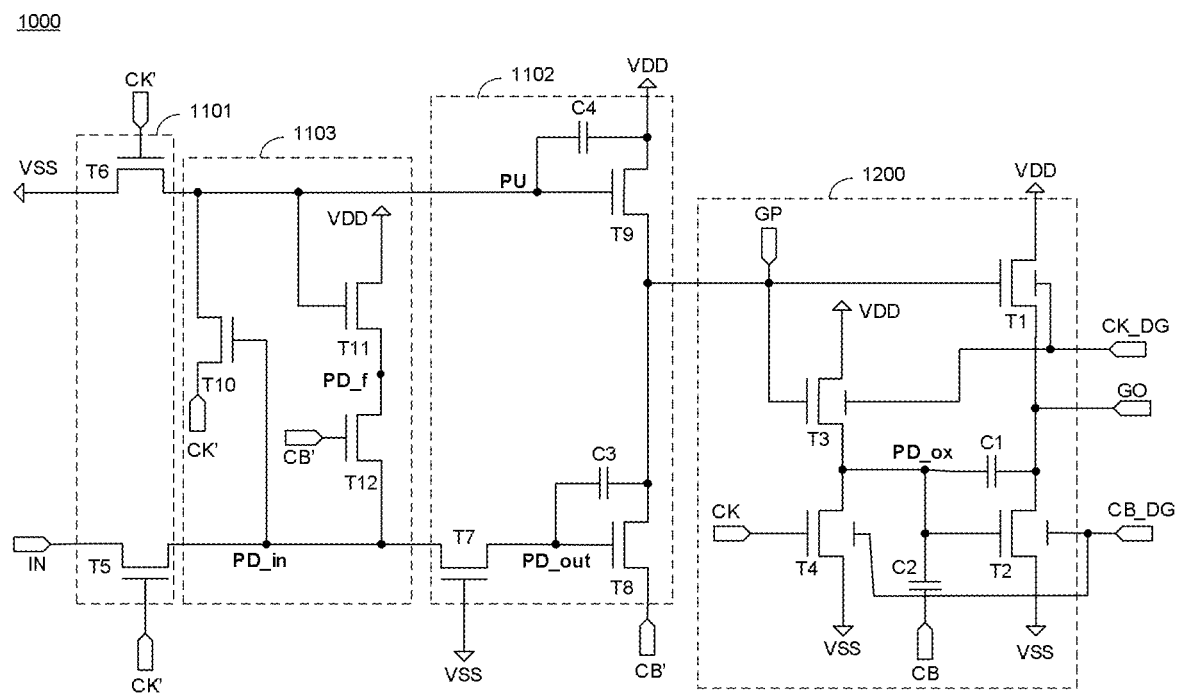
FIG. 10 shows a circuit diagram of a shift register unit according to an embodiment of the present disclosure.

FIG. 10 shows a circuit diagram of a shift register unit according to an embodiment of the present disclosure.

The shift register unit 1000 includes a control circuit and an output circuit 1200.

As shown in FIG. 10, the control circuit may include an input sub-circuit 1101, an output sub-circuit 1102, and an adjustment sub-circuit 1103. In FIG. 10, a clock signal terminal coupled to the control circuit includes a third clock signal terminal CK' and a fourth clock signal terminal CB'. The third clock signal terminal CK' may be the same as or different from a first clock signal terminal CK, and the fourth clock signal terminal CB' may be the same or different from a second clock signal terminal CB.

The input sub-circuit 1101 is coupled to an input signal terminal IN, a reference signal terminal VSS, a third clock signal terminal CK', a first control node PD_in, and a second control node PU. The input sub-circuit 1101 may provide a potential at the input signal terminal IN to the first control node PD_in, and a potential at the reference signal terminal VSS to the second control node PU under control of a signal from the third clock signal terminal CK'. In FIG. 10, the input sub-circuit 1101 includes a fifth transistor T5 and a sixth transistor T6. A gate of the fifth transistor T5 is coupled to the third clock signal terminal CK', a first electrode of the fifth transistor is coupled to the input signal terminal IN, and a second electrode of the fifth transistor T5 is coupled to the first control node PD_in. A gate of the sixth transistor T6 is coupled to the third clock signal terminal CK', a first electrode of the sixth transistor T6 is coupled to the reference signal terminal VSS, and a second electrode of the sixth transistor T6 is coupled to the second control node PU.

The output sub-circuit 1102 is coupled to the first control node PD_in, the second control node PU, an output control terminal GP, the fourth clock signal terminal CB', and the power signal terminal VDD. The output sub-circuit 1102 may provide a potential at the fourth clock signal terminal CB' to the output control terminal GP under control of a potential at the first control node PD_in, and provide a potential at the power signal terminal VDD to the output control terminal GP under control of the second control node PU. In FIG. 10, the output sub-circuit 1102 includes a seventh transistor T7, an eighth transistor T8, a ninth transistor T9, a third capacitor C3, and a fourth capacitor C4. A gate of the seventh transistor T7 is coupled to the reference signal terminal VSS, and a first electrode of the seventh transistor T7 is coupled to the first control node PD_in. A gate of the eighth transistor T8 is coupled to the second electrode of the seventh transistor T7 (for example, coupled to a third control node PD_out), a first electrode of the eighth transistor T8 is coupled to the fourth clock signal terminal CB', and a second electrode of the eighth transistor T8 is coupled to the output control terminal GP. A gate of the ninth transistor T9 is coupled to the second control node PU, a first electrode of the ninth transistor T9 is coupled to the power signal terminal VDD, and a second electrode of the ninth transistor T9 is coupled to the output control terminal GP. A first terminal of the third capacitor C3 is coupled to the gate of the eighth transistor T8, and a second terminal of the third capacitor C3 is coupled to the second electrode of the eighth transistor T8. A first terminal of the fourth capacitor C4 is coupled to the gate of the ninth transistor T9, and a second terminal of the fourth capacitor C4 is coupled to the first electrode of the ninth transistor T9.

The adjustment sub-circuit 1103 is coupled to the third clock signal terminal CK', the fourth clock signal terminal CB', the power signal terminal VDD, the first control node PD_in, and the second control node PU. The adjustment sub-circuit 1103 may provide a potential at the third clock signal terminal CK' to the second control node PU under control of a potential at the first control node PD_in, and provide a potential at the power signal terminal VDD to the the first control node PD_in under control of a potential at the fourth clock signal terminal CB' and a potential at the second control node PU. In FIG. 10, the adjustment sub-circuit 1103 includes a tenth transistor T10, an eleventh transistor T11, and a twelfth transistor T12. A gate of the tenth transistor T10 is coupled to the first control node PD_in, a first electrode of the tenth transistor T10 is coupled to the third clock signal terminal CK', and a second electrode of the tenth transistor T10 is coupled to the second control node PU. A gate of the eleventh transistor T11 is coupled to the second control node PU, and a first electrode of the eleventh transistor T11 is coupled to the power signal terminal VDD. A gate of the twelfth transistor T12 is coupled to the fourth clock signal terminal CB', and a first electrode of the twelfth transistor T12 is coupled to the second electrode of the eleventh transistor T11 (for example, coupled to a fourth control node PD_f), a second electrode of the twelfth transistor T12 is coupled to the first control node PD_in.

Figure 11:
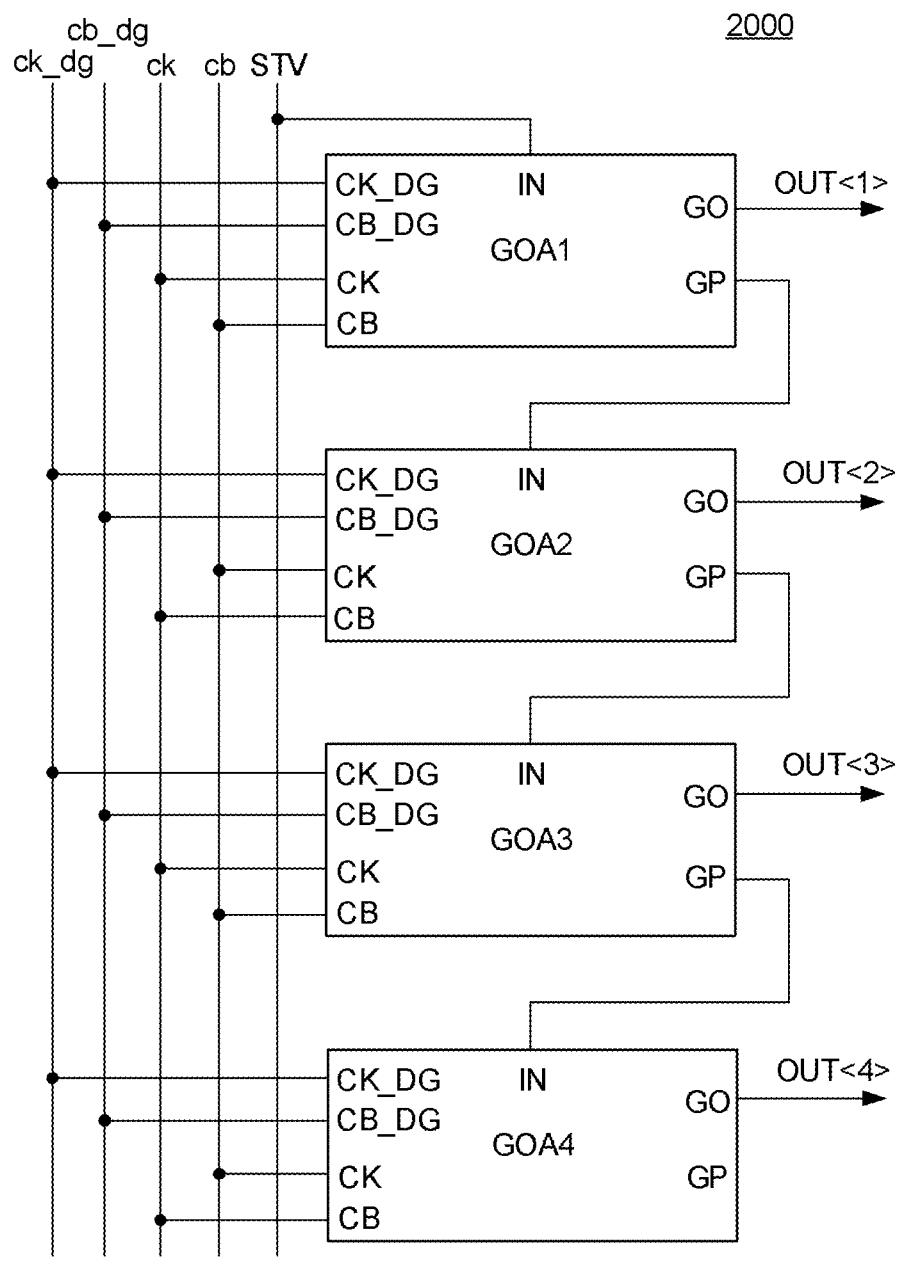
FIG. 11 shows a schematic diagram of a gate driving circuit according to an embodiment of the present disclosure.

FIG. 11 shows a schematic diagram of a gate driving circuit according to an embodiment of the present disclosure.

As shown in FIG. 11, the gate driving circuit 2000 includes a plurality of stages of cascaded shift register units. For ease of description, only the first four stages of shift register units GOA1 to GOA4 are shown. Each shift register unit GOA1 to GOA4 may be implemented by the shift register unit of any of the above described embodiments.

Threshold voltage control terminals of the plurality of stages of cascaded shift register units are coupled to receive a threshold voltage control signal. For example, in FIG. 11, first threshold voltage control terminals CK_DG of the shift register units GOA1 to GOA4 are all coupled to receive a first threshold voltage control signal ck_dg, and second threshold voltage control terminals CB_DG of the shift register units GOA1 to GOA4 are all coupled to receive a second threshold voltage control signal cb_dg. In FIG. 11, for odd-numbered stages of the shift register units, such as the first stage of the shift register unit GOA1 and the third stage of the shift register unit GOA3, the first clock signal terminal CK is coupled to receive a first clock signal ck, and the second clock signal terminal CB is coupled to receive a second clock signal cb; for even-numbered stages of the shift register units, such as the second stage of the shift register unit GOA2 and the fourth stage of the shift register unit GOA4, the first clock signal terminal CK is coupled to receive the second clock signal cb, and the second clock signal terminal CB is coupled to receive the first clock signal ck. The so-called "odd" and "even" may be used interchangeably. The third clock signal terminal and the fourth clock signal terminal (if any, for example in the example of FIG. 10) may be coupled in a similar manner. The input signal terminal IN of the $n^{th}$ stage of the shift register unit GOA(n) is coupled to the output control terminal GP of the $(n-1)^{th}$ stage of the shift register unit GOA(n-1), where n is an integer greater than one. The input signal terminal IN of the first stage of the shift register unit GOA1 may be coupled to receive a start signal STV.

Each stage of the shift register unit may generate corresponding output signal at the output signal terminal thereof according to a signal from the input signal terminal and a signal from the clock signal terminal. Through this cascading manner, the plurality of stages of cascaded shift register units generate a plurality of output signals OUT<1>, OUT<2>, OUT<3>, OUT<4> . . . shifted sequentially to scan each row of pixels on the display panel.

Generally, a frame may include a data update phase and a data hold phase. In the data update phase, each stage of the shift register unit generates output signal to scan each row of pixels, and the scanned pixels may emit light based on the data signal applied to the pixels. This process is also referred to data update. After each stage of the shift register completes pixel scanning, the data hold phase is entered. In the data hold phase, the level of the output signal of each stage of the shift register remains unchanged, and each row of pixels continues to display with the data signals received in the data update phase. This process is also referred to data hold. The operation of the shift register unit of the embodiment of the present disclosure will be described below in conjunction with FIG. 12 and FIG. 13.

Figure 12:
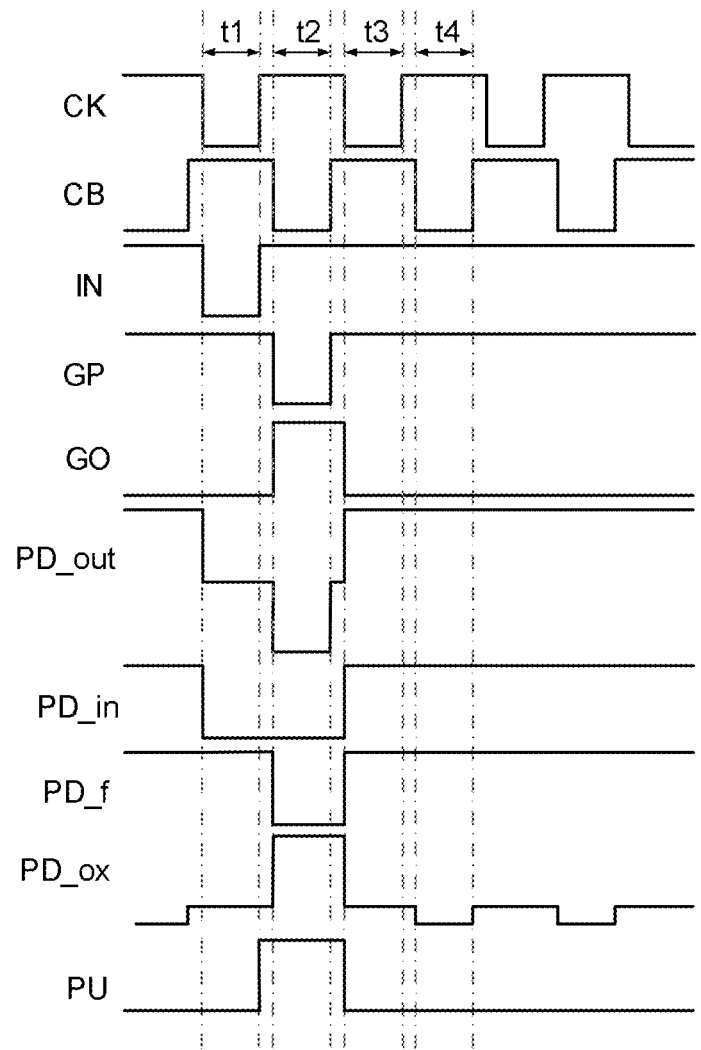
FIG. 12 shows an operation timing diagram of the shift register unit in the data update phase according to an embodiment of the present disclosure.

FIG. 12 shows an operation timing diagram of the shift register unit in the data update phase according to an embodiment of the present disclosure. The operation timing of FIG. 12 will be described below in conjunction with the circuit structure of the shift register unit of FIG. 10. For ease of description, it is assumed that the first clock signal terminal CK and the third clock signal terminal CK' receive the same clock signal, and the second clock signal terminal CB and the fourth clock signal terminal CB' receive the same clock signal.

In period t1, the input signal terminal IN inputs a low level, the third clock signal terminal CK' is at a low level, and the fourth clock signal terminal CB' is at a high level. When the third clock signal terminal CK' is at a low level, the fifth transistor T5 is turned on, so that the first control node PD_in is at a low level. When the reference signal terminal VSS is at a low level, the seventh transistor T7 is turned on, and the low level of the first control node PD_in is transmitted to the third control node PD_out, thereby turning on the eighth transistor T8. When the third clock signal terminal CK' is at a low level, the sixth transistor T6 is also turned on, and the low level of the reference signal terminal VSS is provided to the second control node PU, thereby turning on the ninth transistor T9. Both the eighth transistor T8 and the ninth transistor T9 are turned on so that the output control terminal GP outputs a high-level output control signal. The high level of the output control terminal GP makes the first transistor T1 and the third transistor T3 turn off. When the first clock signal terminal CK is at a low level, the fourth transistor T4 is turned on, so that the low level of the reference signal terminal VSS is provided to the discharge control node PD_ox. When the discharge control node PD_ox is at a low level, the second transistor T2 is turned on, so that the output signal terminal GO outputs a low-level output signal. This period t1 is also referred to input period.

In period t2, the input signal terminal IN inputs a high level, the third clock signal terminal CK' is at a high level, and the fourth clock signal terminal CB' is at a low level. When the third clock signal terminal CK' is at a high level, both the fifth transistor T5 and the sixth transistor T6 are turned off, and the potential at the first control node PD_in is remained at a low level. When the first control node PD_in is at a low level, the tenth transistor T10 is turned on, thereby transmitting the high level of the third clock signal terminal CK' to the second control node PU. When the second control node PU is at a high level, both the ninth transistor T9 and the eleventh transistor T11 are turned off. As the seventh transistor T7 is in the on state, the low level of the first control node PD_in is transmitted to the third control node PD_out, and the eighth transistor T8 is turned on, and the low level of the fourth clock signal terminal CB' is provided to the output control terminal GP, so that the output control terminal GP outputs a low-level output control signal. When the output control terminal GP is at a low level, the first transistor T1 and the third transistor T3 are turned on. The conduction of the first transistor T1 provides the high level of the power signal terminal VDD to the output signal terminal GO. The conduction of the third transistor T3 provides the high level of the power signal terminal VDD to the discharge control node PD_ox. When the discharge control node PD_ox is at a high level, the second transistor T2 is turned off, thereby stopping the pull-down of the output signal terminal GO. This period t2 is also referred to as output period.

In period t3, the input signal terminal IN inputs a high level, the third clock signal terminal CK' is at a low level, and the fourth clock signal terminal CB' is at a high level. When the third clock signal terminal CK' is at a low level, the fifth transistor T5 and the sixth transistor T6 are both turned on, so that the first control node PD_in is at a high level and the second control node PU is at a low level. When the second control node PU is at a low level, the ninth transistor T9 is turned on, so that the output control terminal GP outputs a high-level output control signal. When the output control terminal GP is at a high level, the first transistor T1 and the third transistor T3 are turned off. When the first clock signal terminal CK is at a low level, the fourth transistor T4 is turned on, so that the potential at the discharge control node PD_ox is at a low level. When the discharge control node PD_ox is at a low level, the second transistor T2 is turned on, thereby outputting a low level at the output signal terminal GO. This period t3 is also referred to reset period.

In period t4, the input signal terminal IN inputs a high level, the third clock signal terminal CK' is at a high level, the fourth clock signal terminal CB' is at a low level, and the output control terminal GP outputs a high-level output control signal, the first transistor T1, the third transistor T3, and the fourth transistor T4 are all turned off. As the coupling effect of the second capacitor C2, the low level of the fourth clock signal terminal CB' pulls down the potential at the discharge control node PD_ox, the second transistor T2 is turned on, and the output signal terminal GO outputs a low level.

FIG. 13 shows an operation timing diagram of the shift register unit in the data update phase and the data hold phase according to an embodiment of the present disclosure. The operation timing of FIG. 13 will be described below in conjunction with the circuit structure of the shift register unit of FIG. 10.

As shown in FIG. 13, a frame includes a data update phase and a data hold phase.

In the data update phase, the shift register unit may operate as described above with reference to FIG. 12. During this phase, the first threshold voltage control terminal CK_DG and the second threshold voltage control terminal CB_DG may be at an intermediate level VHM, and the intermediate level VHM may be at 0V, so that the respective threshold voltages of the transistors T1 to T4 of the output circuit are not changed. Of course, other values of VHM may also be applied to adjust the threshold voltages of the transistors T1 to T4 to a desired reference value as required.

In the data hold phase, the shift register unit keeps the output signal at a low level. In the data hold phase, the input signal terminal IN remains to be at a high level, which makes the third clock signal CK' and the fourth clock signal CB' remain at a low level, so that the output control terminal GP remains at a high level. Of course, it is also possible to keep the output control terminal GP at a high level in other ways, for example, by keeping the third clock signal CK' and the fourth clock signal CB' both at a high level or varying between a high level and a low level as required, the output control terminal GP is also kept at a high level. The first clock signal CK and the second clock signal CB remain at a low level, so that the output signal terminal GO remains at a low level. In the data hold phase, the first threshold voltage control signal from the first threshold voltage control terminal CK_DG is at a first level VHH higher than the intermediate level VHM, and the second threshold voltage control signal from the second threshold voltage control terminal CB_DG is at a second level VHL lower than the intermediate level VHM.

The second level VHL (negative voltage) at the second threshold voltage control terminal CB_DG shifts the threshold voltages of the second transistor T2 and the fourth transistor T4 rightwards, such that the second transistor T2 and the fourth transistor T4 (in FIG. 10 are both P-type dual-gate transistors) become depletion type transistors and maintain at on state. Therefore, when the output signal terminal GO and the discharge control node PD_ox have noise, the noise may be removed in time to ensure that the level of the output signal terminal GO remains at the low level of the reference signal terminal VSS. The second level VHL may be set to be lower than the level of the reference signal from the reference signal terminal VSS, for example, approximately twice as low. For example, VSS=−7V, VHL=−15V.

VHH (positive voltage) at the first threshold voltage control terminal CK_DG shifts the threshold voltage of the first transistor T1 and the third transistor T3 leftwards, such that the first transistor T1 and the third transistor T3 (in FIG. 10 are both P-type dual-gate transistors) become enhancement type transistors, the gate-source voltage Vgs=0, and the transmission curve is in the straight section IV, minimizing the leakage of the first transistor T1 and the third transistor T3, and extending the time during which the level of the output signal terminal GO is stabilized at the low level of the reference signal terminal VSS. The first level VHH may be set to be higher than the level of the power signal from the power signal terminal VDD, for example, a few volts higher, but not more than twice the level of the VDD. For example, VDD=7V, VHH=10V.

For the circuit structure of FIG. 10, if the first transistor T1 to the fourth transistor T4 are all single-gate transistors, there will be a lot of noise in the output signal at an ultra-low refresh frequency (such as 1 Hz), even as high as 1.46V. In contrast, the embodiment of the present disclosure effectively reduces the noise in the output signal by providing the dual-gate transistor in the output circuit of the shift register unit and adjusting its threshold voltage. Even at a low refresh frequency, the output signal may be maintained at a stable level.

Although the operation timing has been described above with reference to the shift register unit of FIG. 10, the embodiments of the present disclosure are not limited thereto. For the shift register unit of any embodiment of the present disclosure, a similar manner may be used to adjust the threshold voltage of any one or more transistors in the output circuit. In addition, although the embodiments of the present disclosure are described by using P-type transistors as an example, the embodiments of the present disclosure may also be applied to N-type transistors. The threshold voltage of any one or more transistors in the output circuit may also be adjusted by correspondingly changing the waveform of the threshold voltage control signal.

FIG. 14 shows a flowchart of a method for driving a shift register unit according to an embodiment of the present disclosure.

In step S101, in the first period (for example, the above described data update phase), a control circuit provides an output control signal to an output control terminal based on a signal from an input signal terminal and a signal from a clock signal terminal, and an output circuit provides an output signal to an output signal terminal under control of a potential at the output control terminal.

In step S102, in the second period (for example, the above described data hold phase), the control circuit provides the output control signal to the output control terminal based on the signal from the input signal terminal and the signal from the clock signal terminal, and the output circuit keeps the level of the output signal from the output signal terminal under control of a potential at the output control terminal, and adjusts the threshold voltage of at least one of the plurality of transistors in the output circuit under control of a signal from the threshold voltage control terminal.

For example, for the case that at least one of the first transistor T1 and the third transistor T3 is a dual-gate transistor (as shown in FIG. 3, FIG. 5, and FIG. 7) as described above, the threshold voltage control signal being at a first level VHH may be applied to the first threshold voltage control terminal CK_DG, so as to make the threshold voltage of the first transistor T1 and/or the third transistor T3 shift to the right, thereby becoming an enhancement type transistor.

For the case that at least one of the second transistor T2 and the fourth transistor T4 is a dual-gate transistor (as shown in FIG. 4, FIG. 6 and FIG. 7) as described above, the threshold voltage control signal being at a second level VHL may be applied to the second threshold voltage control terminal CB_DG, so as to make the threshold voltage of the second transistor T2 and/or the fourth transistor T4 shift to the left, thereby becoming a depletion type transistor.

Figure 15:
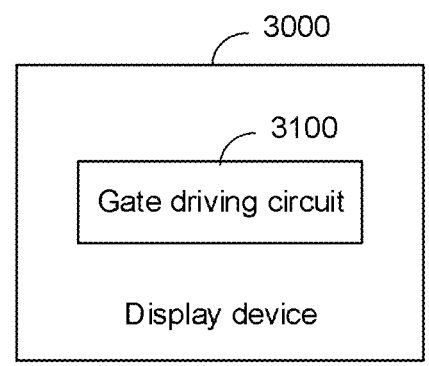
FIG. 15 shows a schematic diagram of a display device according to an embodiment of the present disclosure.

FIG. 15 shows a schematic diagram of a display device according to an embodiment of the present disclosure. As shown in FIG. 15, the display device 3000 includes a gate driving circuit 3100. The gate driving circuit 3100 may be implemented by the gate driving circuit of any of the above described embodiments. The display device 3000 according to the embodiment of the present disclosure may be any product or component with a display function, such as electronic paper, mobile phone, tablet computer, television, display, notebook computer, digital photo frame, navigator, etc.

It should be noted that in the above description, the technical solutions of the embodiments of the present disclosure are shown only by way of example, but it does not mean that the embodiments of the present disclosure are limited to the above steps and structures. Where possible, the steps and structures may be adjusted and selected as needed. Therefore, some steps and units are not essential elements for implementing the overall inventive idea of the embodiments of the present disclosure.

So far, the present disclosure has been described in conjunction with the preferred embodiments. It should be understood that those skilled in the art may make various other changes, substitutions and additions without departing from the spirit and scope of the embodiments of the present disclosure. Therefore, the scope of the embodiments of the present disclosure is not limited to the above specific embodiments, but should be defined by the appended claims.

What is claimed is:

1. A shift register unit, comprising:
   a control circuit coupled to an input signal terminal, a clock signal terminal, and an output control terminal, and configured to provide an output control signal to the output control terminal based on a signal from the input signal terminal and a signal from the clock signal terminal; and
   an output circuit coupled to the output control terminal, an output signal terminal, and a threshold voltage control terminal, and configured to provide an output signal to the output signal terminal under control of a potential at the output control terminal, and adjust a threshold voltage of at least one of a plurality of transistors in the output circuit under control of a signal from the threshold voltage control terminal,
   wherein the output circuit comprises:
   a charging sub-circuit coupled to a power signal terminal, the output control terminal, and the output signal terminal, and configured to provide a potential at the power signal terminal to the output signal terminal under control of a potential at the output control terminal;
   a discharging sub-circuit coupled to a discharge control node, a reference signal terminal, and the output signal terminal, and configured to provide a potential at the reference signal terminal to the output signal terminal under control of a potential at the discharge control node; and
   a control sub-circuit coupled to the output control terminal and the discharge control node, and configured to control the potential at the discharge control node based on the potential at the output control terminal,
   wherein at least one of the charging sub-circuit, the discharging sub-circuit, and the control sub-circuit is further coupled to the threshold voltage control terminal and is further configured to adjust a threshold voltage of at least one of the plurality of transistors in the at least one of the charging sub-circuit, the discharging sub-circuit, and the control sub-circuit under control of a signal from the threshold voltage control terminal.

2. The shift register unit according to claim 1, wherein the charging sub-circuit comprises a first transistor, a gate of the first transistor is coupled to the output control terminal, a first electrode of the first transistor is coupled to the power signal terminal, and a second electrode of the first transistor is coupled to the output signal terminal.

3. The shift register unit according to claim 2, wherein the threshold voltage control terminal comprises a first threshold voltage control terminal, and the first transistor is a dual-gate transistor having a first gate and a second gate, the first gate of the first transistor is coupled to the output control terminal, and the second gate of the first transistor is coupled to the first threshold voltage control terminal.

4. The shift register unit according to claim 1, wherein the discharging sub-circuit comprises:
   a second transistor, a gate of the second transistor is coupled to the discharge control node, a first electrode of the second transistor is coupled to the reference signal terminal, and a second electrode of the second transistor is coupled to the output signal terminal; and a first capacitor, a first terminal of the first capacitor is coupled to the discharge control node, and a second terminal of the first capacitor is coupled to the output signal terminal.

5. The shift register unit according to claim 4, wherein the threshold voltage control terminal comprises a second threshold voltage control terminal, and the second transistor is a dual-gate transistor having a first gate and a second gate, the first gate of the second transistor is coupled to the discharge control node, and the second gate of the second transistor is coupled to the second threshold voltage control terminal.

6. The shift register unit according to claim 4, wherein the threshold voltage control terminal comprises a first threshold voltage control terminal and a second threshold voltage control terminal, and the first transistor and the second transistor are both dual-gate transistors having a first gate and a second gate,
wherein the first gate of the first transistor is coupled to the output control terminal, and the second gate of the first transistor is coupled to the first threshold voltage control terminal;
the first gate of the second transistor is coupled to the discharge control node, and the second gate of the second transistor is coupled to the second threshold voltage control terminal.

7. The shift register unit according to claim 1 wherein the control sub-circuit comprises:
a third transistor, a gate of the third transistor is coupled to the output control terminal, a first electrode of the third transistor is coupled to the power signal terminal, and a second electrode of the third transistor is coupled to the discharge control node;
a fourth transistor, a gate of the fourth transistor is coupled to a first clock signal terminal, a first electrode of the fourth transistor is coupled to the reference signal terminal, and a second electrode of the fourth transistor is coupled to the discharge control node; and
a second capacitor, a first terminal of the second capacitor is coupled to a second clock signal terminal, and a second terminal of the second capacitor is coupled to the discharge control node.

8. The shift register unit according to claim 7, wherein the threshold voltage control terminal comprises a first threshold voltage control terminal, and the third transistor is a dual-gate transistor having a first gate and a second gate, the first gate of the third transistor is coupled to the output control terminal, and the second gate of the third transistor is coupled to the first threshold voltage control terminal.

9. The shift register unit according to claim 7, wherein the threshold voltage control terminal comprises a second threshold voltage control terminal, and the fourth transistor is a dual-gate transistor having a first gate and a second gate, the first gate of the fourth transistor is coupled to the first clock signal terminal, and the second gate of the fourth transistor is coupled to the second threshold voltage control terminal.

10. The shift register unit according to claim 7, wherein the threshold voltage control terminal comprises a first threshold voltage control terminal and a second threshold voltage control terminal, and the third transistor and the fourth transistor are both dual-gate transistors having a first gate and a second gate, wherein the first gate of the third transistor is coupled to the output control terminal, and the second gate of the third transistor is coupled to the first threshold voltage control terminal;
the first gate of the fourth transistor is coupled to the first clock signal terminal, and the second gate of the fourth transistor is coupled to the second threshold voltage control terminal.

11. The shift register unit according to claim 1, wherein the control circuit comprises:
an input sub-circuit coupled to an input signal terminal, a reference signal terminal, a third clock signal terminal, a first control node, and a second control node, and configured to provide a potential at the input signal terminal to the first control node, and a potential at the reference signal terminal to the second control node under control of a signal from the third clock signal terminal;
an output sub-circuit coupled to the first control node, the second control node, the output control terminal, a fourth clock signal terminal, and the power signal terminal, and configured to provide a potential at the fourth clock signal terminal to the output control terminal under control of a potential at the first control node, and provide a potential at the power signal terminal to the output control terminal under control of the second control node; and
an adjustment sub-circuit coupled to the third clock signal terminal, the fourth clock signal terminal, the power signal terminal, the first control node, and the second control node, and configured to provide a potential at the third clock signal terminal to the second control node under control of the potential at the first control node, and provide the potential at the power signal terminal to the first control node under control of the potential at the fourth clock signal terminal and a potential at the second control node.

12. The shift register unit according to claim 11, wherein the input sub-circuit comprises:
a fifth transistor, a gate of the fifth transistor is coupled to the third clock signal terminal, a first electrode of the fifth transistor is coupled to the input signal terminal, and a second electrode of the fifth transistor is coupled to the first control node; and
a sixth transistor, a gate of the sixth transistor is coupled to the third clock signal terminal, a first electrode of the sixth transistor is coupled to the reference signal terminal, and a second electrode of the sixth transistor is coupled to the second control node.

13. The shift register unit according to claim 11, wherein the output sub-circuit comprises:
a seventh transistor, a gate of the seventh transistor is coupled to the reference signal terminal, and a first electrode of the seventh transistor is coupled to the first control node;
an eighth transistor, a gate of the eighth transistor is coupled to the second electrode of the seventh transistor, a first electrode of the eighth transistor is coupled to the fourth clock signal terminal, and a second electrode of the eighth transistor is coupled to the output control terminal;
a ninth transistor, a gate of the ninth transistor is coupled to the second control node, a first electrode of the ninth transistor is coupled to the power signal terminal, and a second electrode of the ninth transistor is coupled to the output control terminal;

a third capacitor, a first terminal of the third capacitor is coupled to the gate of the eighth transistor, and a second terminal of the third capacitor is coupled to the second electrode of the eighth transistor; and a fourth capacitor, a first terminal of the fourth capacitor is coupled to the gate of the ninth transistor, and a second terminal of the fourth capacitor is coupled to the first electrode of the ninth transistor.

14. The shift register unit according to claim 11, wherein the adjustment sub-circuit comprises:

a tenth transistor, a gate of the tenth transistor is coupled to the first control node, a first electrode of the tenth transistor is coupled to the third clock signal terminal, and a second electrode of the tenth transistor is coupled to the second control node;

an eleventh transistor, a gate of the eleventh transistor is coupled to the second control node, and a first electrode of the eleventh transistor is coupled to the power signal terminal; and a twelfth transistor, a gate of the twelfth transistor is coupled to the fourth clock signal terminal, a first electrode of the twelfth transistor is coupled to the second electrode of the eleventh transistor, and a second electrode of the twelve transistor is coupled to the first control node.

15. A gate driving circuit comprising a plurality of stages of cascaded shift register units according to claim 1, wherein threshold voltage control terminals of the plurality of stages of cascaded shift register units are coupled to receive a threshold voltage control signal.

16. A display device comprising the gate driving circuit according to claim 15.

17. A method for driving a shift register unit according to claim 1, comprising:

in first period, providing, by a control circuit, an output control signal to an output control terminal based on a signal from an input signal terminal and a signal from a clock signal terminal, and providing, by an output circuit, an output signal to an output signal terminal under control of a potential at the output control terminal; and in second period, providing, by the control circuit, the output control signal to the output control terminal based on the signal from the input signal terminal and the signal from the clock signal terminal, and keeping, by the output circuit, a level of the output signal from the output signal terminal under control of the potential at the output control terminal, and adjusting a threshold voltage of at least one of a plurality of transistors in the output circuit under control of a signal from a threshold voltage control terminal.

18. The method according to claim 17, wherein the output circuit comprises a first transistor, a second transistor, a third transistor, and a fourth transistor, the threshold voltage control terminal comprises a first threshold voltage control terminal, and at least one of the first transistor and the third transistor is a dual-gate transistor having a first gate and a second gate coupled to the first threshold voltage control terminal, and adjusting a threshold voltage of at least one of a plurality of transistors in the output circuit under control of a signal from a threshold voltage control terminal comprising:

applying a threshold voltage control signal being at a first level to the first threshold voltage control terminal, to change the threshold voltage of the at least one of the first transistor and the third transistor, such that the at least one of the first transistor and the third transistor becomes an enhancement type transistor.

19. The method according to claim 18, wherein the first level is higher than a level of a power signal from a power signal terminal coupled to the first transistor and the third transistor.

20. The method according to claim 17, wherein the output circuit comprises a first transistor, a second transistor, a third transistor, and a fourth transistor, and the threshold voltage control terminal comprises a second threshold voltage control terminal, and at least one of the second transistor and the fourth transistor is a dual-gate transistor having a first gate and a second gate coupled to the second threshold voltage control terminal, and adjusting a threshold voltage of at least one of a plurality of transistors in the output circuit under control of a signal from a threshold voltage control terminal comprising:

applying a threshold voltage control signal being at a second level to the second threshold voltage control terminal, to change the threshold voltage of the at least one of the second transistor and the fourth transistor, such that the at least one of the second transistor and the fourth transistor becomes a depletion type transistor, wherein the second level is lower than a level of a reference signal from a reference signal terminal coupled to the second transistor and the fourth transistor.

* * * * *